United States Patent
La et al.

(10) Patent No.: US 6,842,373 B2
(45) Date of Patent: Jan. 11, 2005

(54) COMMAND DECODER AND DECODING METHOD FOR USE IN SEMICONDUCTOR MEMORY DEVICE

(75) Inventors: One-Gyun La, Gyeonggi-do (KR); June-Bae Lee, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 246 days.

(21) Appl. No.: 10/192,900

(22) Filed: Jul. 10, 2002

(65) Prior Publication Data

US 2003/0053342 A1 Mar. 20, 2003

(30) Foreign Application Priority Data

Jul. 20, 2001 (KR) ........................................ 2001-43898

(51) Int. Cl.[7] .............................................. G11C 16/04
(52) U.S. Cl. .............................. 365/185.11; 365/185.04; 365/185.05; 365/233
(58) Field of Search ..................... 365/185.11, 185.04, 365/185.05, 203, 233, 233.5

(56) References Cited

U.S. PATENT DOCUMENTS 6,108,243 A      8/2000 Suzuki et al.
6,166,993 A  *  12/2000 Yamauchi ................ 365/233.5
6,515,900 B2 *   2/2003 Kato et al. ............. 365/185.11

* cited by examiner

Primary Examiner—David Nelms
Assistant Examiner—Long Tran
(74) Attorney, Agent, or Firm—Marger Johnson & McCollom, P.C.

(57) ABSTRACT

Embodiments of the invention provide a command decoder and related circuitry for use in a semiconductor memory device that can operate both as a double rate synchronous dynamic random access random access memory device, and a fast cycle random access memory device.

31 Claims, 9 Drawing Sheets

COMMAND DECODER AND DECODING METHOD FOR USE IN SEMICONDUCTOR MEMORY DEVICE

CROSS REFERENCE TO RELATED APPLICATIONS

This application claims priority from Korean Priority Document No. 2001-43898, filed on Jul. 20, 2001, which is hereby incorporated by reference in its entirety.

BACKGROUND OF THE INVENTION

1. Field of the Invention

This disclosure relates to a semiconductor memory device, and more particularly, to a command decoder and decoding method for use in a semiconductor memory device.

2. Description of Related Art

A command decoder for use in a double data rate synchronous dynamic random access memory (DDR SDRAM) device receives and decodes an inverted chip selecting signal CSB, an inverted row address strobe signal RASB, an inverted column address strobe signal CASB, and an inverted write enable signal WEB at a rising edge of a clock signal CLK to generate a mode setting command MRS, an active command ACTIVE, a pre-charge command PRECHARGE, a write command WRITE, a read command READ, and a refresh command REFRESH.

FIG. 1 is a timing diagram illustrating an operation of a conventional command decoder for use in a DDR SDRAM device.

When an inverted chip selecting signal CSB having a logic "low" level, an inverted row address strobe signal RASB having a logic "low" level, an inverted column address strobe signal CASB having a logic "low" level, and an inverted write enable signal WEB having a logic "low" level are applied externally at a rising edge of a clock signal CLK, a command decoder internally generates a mode setting command MRS.

When the inverted chip selecting signal CSB having a logic "low" level, the inverted row address strobe signal RASB having a logic "low" level, an inverted column address strobe signal CASB having a logic "high" level, and the inverted write enable signal WEB having a logic "high" level are applied externally at a rising edge of the clock signal CLK, the command decoder generates an active command ACTIVE internally.

When the inverted chip selecting signal CSB having a logic "low" level, the inverted row address strobe signal RASB having a logic "low" level, the inverted column address strobe signal CASB having a logic "high" level, and the inverted write enable signal WEB having a logic "low" level are applied externally at a rising edge of a clock signal CLK, the command decoder internally generates a pre-charge command PRECHARGE.

When the inverted chip selecting signal CSB having a logic "low" level, the inverted row address strobe signal RASB having a logic "high" level, the inverted column address strobe signal CASB having a logic "low" level, and the inverted write enable signal WEB having a logic "low" level are applied externally at a rising edge of a clock signal CLK, the command decoder internally generates a write command WRITE.

When the inverted chip selecting signal CSB having a logic "low" level, the inverted row address strobe signal RASB having a logic "high" level, the inverted column address strobe signal CASB having a logic "low" level, and the inverted write enable signal WEB having a logic "high" level are applied externally at a rising edge of a clock signal CLK, the command decoder internally generates a read command READ.

When the inverted chip selecting signal CSB having a logic "low" level, the inverted row address strobe signal RASB having a logic "low" level, the inverted column address strobe signal CASB having a logic "low" level, and the inverted write enable signal WEB having a logic "high" level are applied externally at a rising edge of a clock signal CLK, the command decoder internally generates a refresh command REFRESH.

Table 1 shows a generation of internal command signals MRS, ACTIVE, PRECHARGE, WRITE, READ, and REFRESH according to a state of external command signals CLK, CSB, RASB, CASB, and WEB of the conventional DDR SDRAM device.

TABLE 1

| Internal command<br>External Command | MRS | ACTIVE | PRECHARGE | WRITE | READ | REFRESH |
|---|---|---|---|---|---|---|
| CSB | L | L | L | L | L | L |
| RASB | L | L | L | H | H | L |
| CASB | L | H | H | L | L | L |
| WEB | L | H | L | L | H | H |

In Table 1, "L" denotes a logic "low" level, and "H" denotes a logic "high" level Accordingly, the command decoder for use in the conventional DDR SDRAM device has a simple circuit configuration.

A command decoder for use in a fast cycle random access memory (FCRAM) device receives and decodes an inverted chip selecting signal CSB and a signal FN for two cycles to generate a mode setting signal MRS, a read command READ, a write command WRITE, and a refresh command REFRESH.

FIG. 2 is a timing diagram illustrating an operation of a command decoder for use in a conventional FCRAM device.

When a read command RDA including an inverted chip selecting signal CSB having a logic "low" level and a signal FN having a logic "high" level is applied at a rising edge of a first clock signal CLK and a mode setting signal MRS including the inverted chip selecting signal CSB having a logic "low" level are applied at a rising edge of a second clock signal CLK, a command decoder generates a mode setting signal MRS.

When the read command RDA is applied at a rising edge of a first clock signal CLK and a lower address latch command LAL including the inverted chip selecting signal CSB having a logic "high" level is applied at a rising edge of a second clock signal CLK, the command decoder generates a read command READ.

When a write command WRA including the inverted chip selecting signal CSB having a logic "low" level and the signal FN having a logic "low" level is applied at a rising edge of a first clock signal CLK and a refresh command REF including the inverted chip selecting signal CSB having a logic "low" level is applied at a rising edge of a second clock signal CLK, the command decoder generates a refresh command REFRESH.

When the write command WRA is applied at a rising edge of a first clock signal CLK and the lower address latch command LAL is applied at a rising edge of a second clock signal CLK, the command decoder generates a write command WRITE.

Table 2 shows a generation of internal command signals MRS, WRITE, READ, and REFRESH according to a state of external command signals CLK, CSB, and FN (RDA, MRS, WRA, LAL) of the conventional DDR SDRAM device.

TABLE 2

| Internal Command | MRS | READ | REFRESH | WRITE | | | | |
|---|---|---|---|---|---|---|---|---|
| External command | First RDA | Second MRS | First RDA | Second LAL | First WRA | Second LAL | First WRA | Second LAL |
| CSB | L | L | L | H | L | L | L | H |
| FN | H | X | H | X | L | X | L | X |

In Table 2, "L" denotes a logic "low" level, "H" denotes a logic "high" level, and "X" denotes a "don't care".

As described above, command decoders of the DDR SDRAM device and the FCRAM device have different decoding methods and different circuit configurations.

Recently, development has begun on a semiconductor memory device that can operate as both a DDR SDRAM device and a FCRAM device. However, as described above, the command decoders work completely differenctly.

SUMMARY OF THE INVENTION

Preferred embodiments of the present invention provide a command decoder for use in a semiconductor memory device which can operate as both a double data rate synchronous dynamic random access memory device and a fast cycle random access memory device.

Additionally, a command decoder according to embodiments of the invention can be used in a fast cycle random access memory device.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFFERED EMBODIMENTS

Reference will now be made in detail to preferred embodiments of the present invention, examples of which are illustrated in the accompanying drawings.

Figure 1:
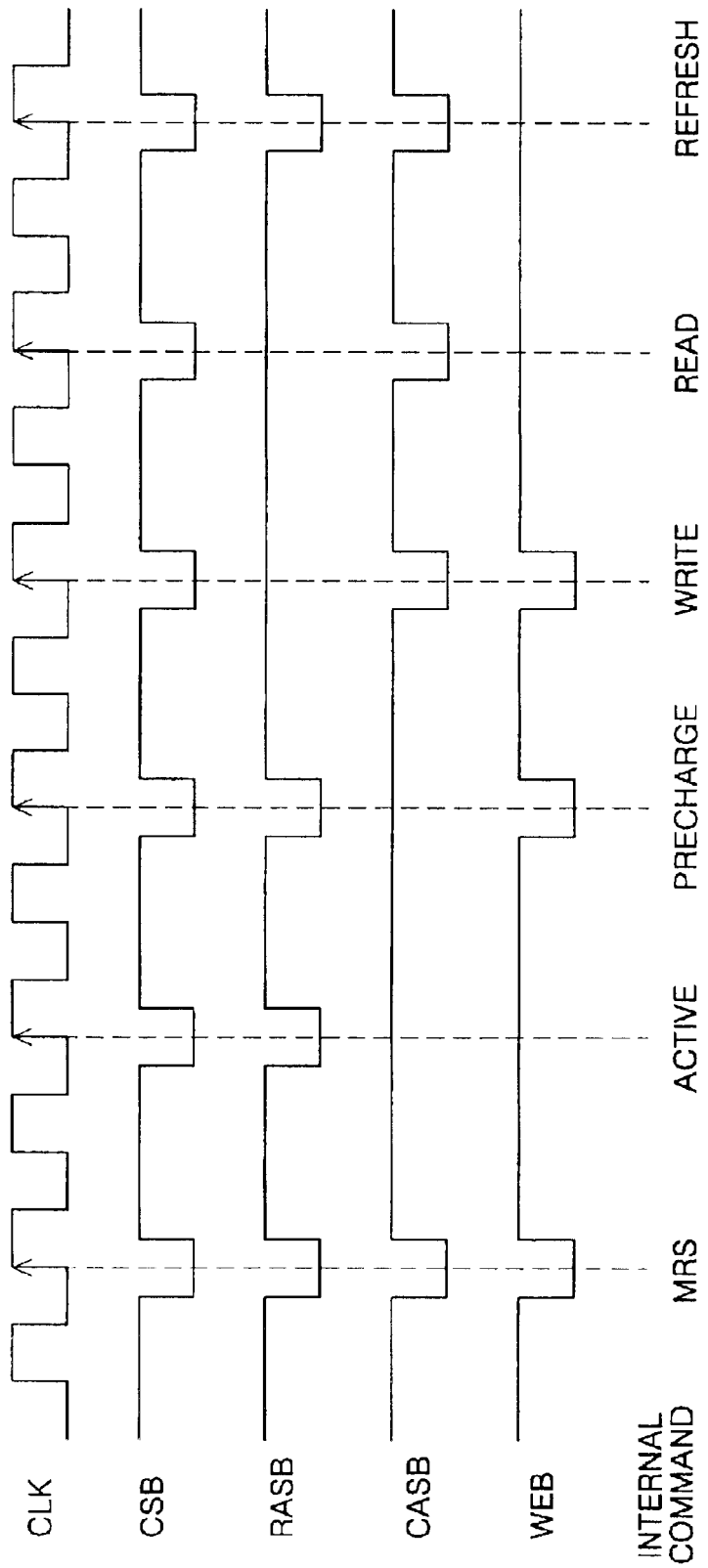
FIG. 1 is a timing diagram illustrating an operation of a conventional command decoder for use in a DDR SDRAM device.
Figure 2:
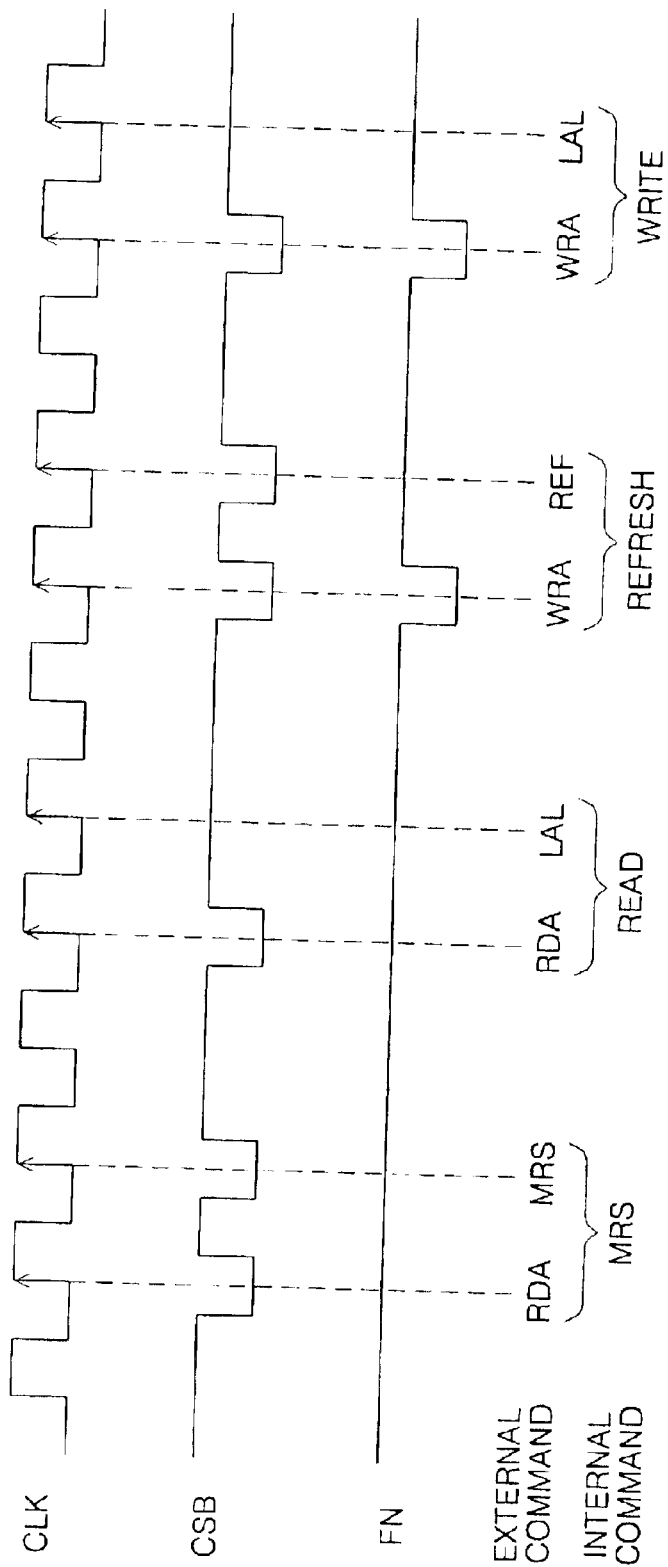
FIG. 2 is a timing diagram illustrating an operation of a command decoder for use in a conventional FCRAM device.
Figure 3:
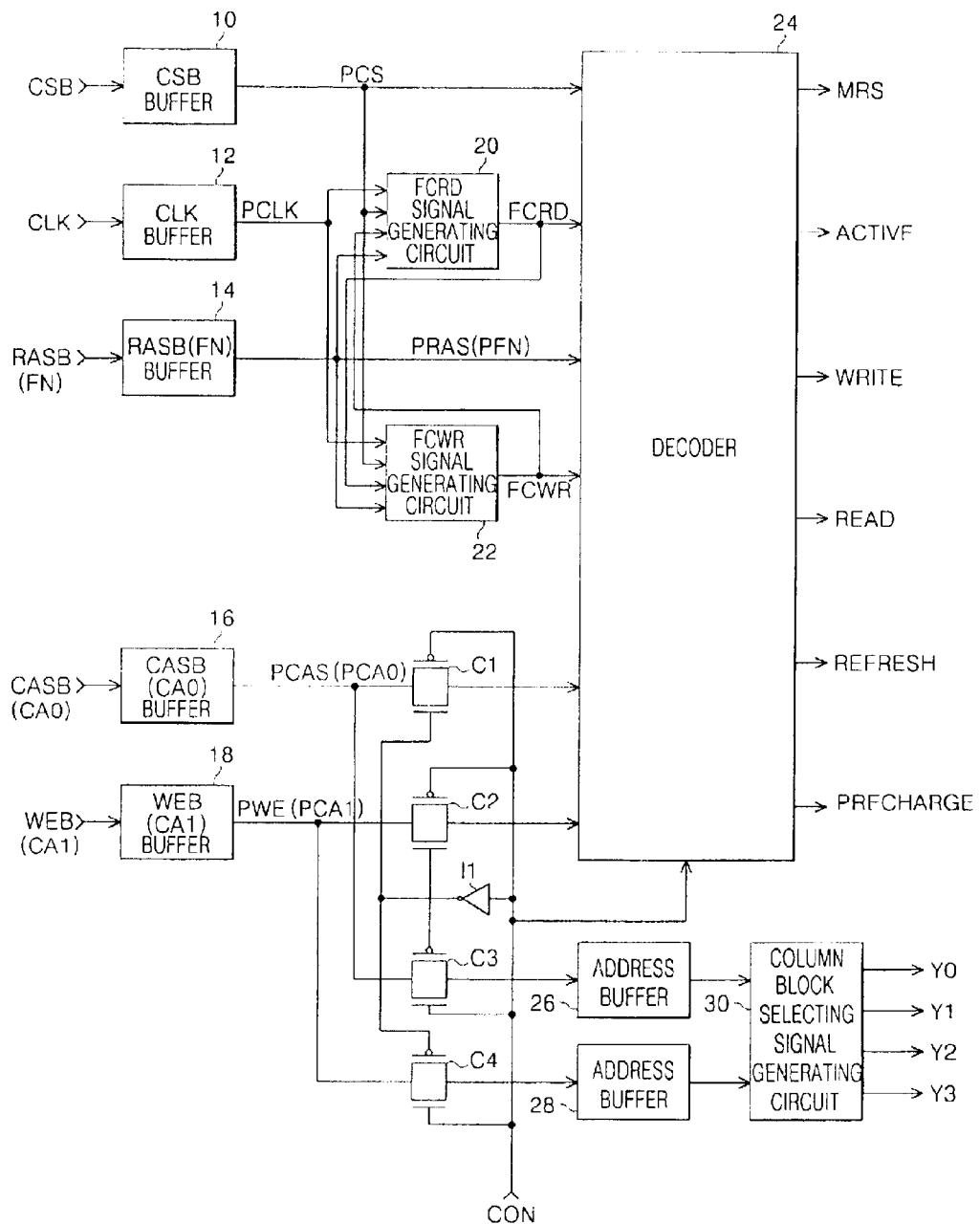
FIG. 3 is a block schematic diagram illustrating a command decoder for use in a semiconductor memory device which can operate as both a double data rate synchronous dynamic random access memory (DDR SDRAM) device and a fast cycle random access memory (FCRAM) device according to an embodiment of the invention.

FIG. 3 is a block diagram illustrating a command decoder for use in a semiconductor memory device which can operate as both a double data rate synchronous dynamic random access memory (DDR SDRAM) device and a fast cycle random access memory (FCRAM) device.

The command decoder of FIG. 3 includes a CSB buffer 10, a CLK buffer 12, a RASB (FN) buffer 14, a CASB (CA0) buffer 16, a WEB (CA1) buffer 18, a FCRD signal generating circuit 20, a FCWR signal generating circuit 22, a decoder 24, address buffers 26 and 28, a column block selecting signal generating circuit 30, CMOS transmission gates C1 to C4, and an inverter I1.

When the command decoder of FIG. 3 operates as the DDR SDRAM device, command signals CSB, RASB, CASB, and WEB are applied through CSB, RASB, CASB, and WEB signal applying pins (not shown). When the command decoder of FIG. 3 operates as the FCRAM device, signals CSB and FN are applied through CSB and RASB signal applying pins (not shown), and a 2-bit lower address is applied through CASB and WEB signal applying pins (not shown).

An operation of the command decoder of FIG. 3 is described below.

The CSB buffer 10 buffers an inverted chip selecting signal CSB to generate a signal PCS. The CLK buffer 12 buffers a clock signal CLK to generate a signal PCLK. The signal PCLK is a short pulse that transits to a logic "high" level at a rising edge of a clock signal CLK and transits to a logic "low" level in a short time period. The RASB (FN) buffer 14 buffers an inverted row address strobe signal RASB to generate a signal PRAS when the memory device operates as the DDR SDRAM device, and buffers a signal FN to generate a signal PFN when the memory device operates as the FCRAM device. That is, when the memory device operates as the FCRAM device, the RASB (FN) buffer 14 receives the signal FN applied through the inverted row address strobe signal applying pin (not shown). The CASB (CA0) buffer 16 buffers an inverted column address strobe signal CASB to generate a signal PCAS when the memory device operates as the DDR SDRAM device, and buffers an address CA0 to generate a signal PCA0 when the memory device operates as the FCRAM device. The WEB (CA1) buffer 18 buffers an inverted write enable signal WEB to generate a signal PWE when the memory device operates as the double data rate SDRAM, and buffers an address CA1 to generate a signal PCA1 when the memory device operates as the FCRAM device.

The FCRD signal generating circuit 20 generates a signal FCRD which transits to a logic "high" level at a falling edge of the clock signal PCLK when the signal PCS having a logic "low" level and the signal PFN having a logic "high" level are applied in a first external command applying cycle, and transits to a logic "low" level at a falling edge of the next clock signal PCLK in response to signals FCRD and FCWR. The FCWR signal generating circuit 22 generates a signal FCWR which transits to a logic "high" level at a falling edge of the clock signal PCLK when the signals PCS having a logic "low" level and PFN having a logic "low" level are applied in a first external command applying cycle, and transits to a logic "low" level at a falling edge of the next clock signal PCLK in response to signals FCRD and FCWR. The CMOS transmission gates C1 and C2 transmit the signals PCAS and PWE to the decoder 24 in response to a control signal CON having a logic "low" level. The decoder 24 decodes signal PCS, FCRD, PFN, and FCWR to generate internal command signals MRS, ACTIVE, WRITE, READ, and REFRESH when the memory device operates as the DDR SDRAM device, and decodes signals PCS, PRAS, PCAS, and PWE to generate internal command signals MRS, ACTIVE, PRECHARGE, WRITE, READ, and REFRESH when the memory device operates as the FCRAM device. The CMOS transmission gates C3 and C4 respectively transfer the signals PCA0 and PCA1 to the address buffers 26 and 28 in response to the control signal CON having a logic "high" level, The address buffers 26 and 28 buffer the signals PCA0 and PCA1 and output the buffered signals to the column block selecting signal generating circuit 30, respectively. The column block selecting signal generating circuit 30 decodes signals output from the address buffers 26 and 28 to generate column block selecting signals Y0 to Y3.

The command decoder of FIG. 3 operates as a command decoder of the DDR SDRAM when the control signal has a logic "low" level, and operates as that of the FCRAM device when the control signal has a logic "high" level.

In FIG. 3, the address buffers 26 and 28 and the column block selecting signal generating circuit 30 decode a 2-bit lower column address applied externally to generate selecting signals Y0 to Y3 for selecting column blocks of a memory cell array when the memory device operates as the FCRAM device. The FCRAM device receives a row address and the 2-bit lower address column address together. Accordingly, selected is a word line of a memory cell array block selected by combining row block selecting signals for selecting row memory cell array blocks and column block selecting signals Y0 to Y3 for selecting a column memory cell array blocks. This is disclosed in U.S. Pat. No. 6,108,243, which is incorporated herein by reference and therefore its detail description is omitted here.

In FIG. 3, the inventive semiconductor memory device can permanently operate as both the DDR SDRAM device or the FCRAM device by fixing the control signal CON to one level by a metal option or a bonding option. However, the inventive semiconductor memory device can also selectively operate as either the DDR SDRAM device or the FCRAM device by manipulating the control signal CON by various methods. For example, a level of the control signal CON can be set to a logic "high" level or a logic "low" level using a mode setting register, which is generally employed in a semiconductor memory device.

Figure 4:
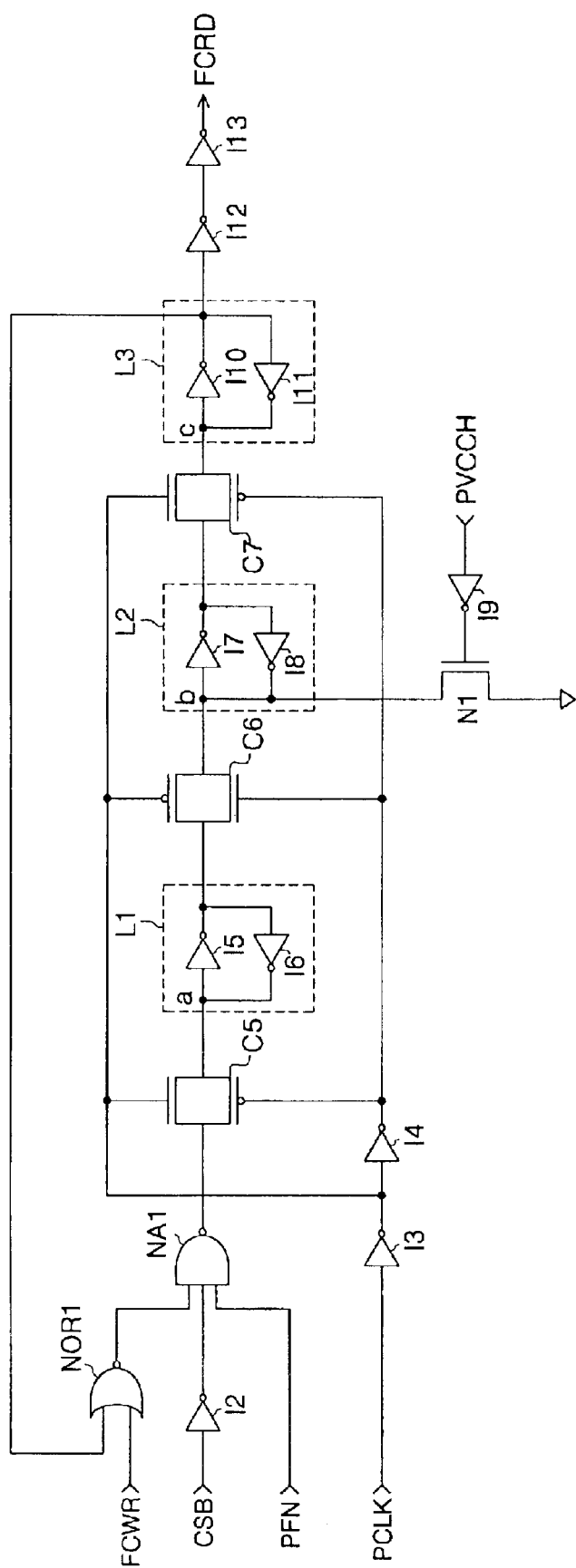
FIG. 4 is a circuit diagram illustrating the FCRD signal generating circuit of FIG. 3.

FIG. 4 is a circuit diagram illustrating the FCRD signal generating circuit 20 of FIG. 3. The FCRD signal generating circuit of FIG. 4 includes a NOR gate NOR1, a NAND gate NA1, inverters I2 to I13, and CMOS transmission gates C5 to C7. The inverters I5 and I6, the inverters I7 and I8, and the inverters I10 and I11 constitute latches L1, L2 and L3, respectively.

The inverter I2 inverts the signal PCS that is input from the pin labeled CSB (FIG. 3). The NOR gate NOR1 NORs the signals FCRD and FCWR. The NAND gate NA1 NANDs output signals of the inverter I2 and the NOR gate NOR1. The inverter I3 inverts the signal PCLK. The inverter I4 inverts an output signal of the inverter I3. The CMOS transmission gate C5 transfers an output signal of the NAND gate NA1 to a node "a" in response to the signal PCLK having a logic "low" level. The latch L1 inverts and latches a signal at the node "a". The CMOS transmission gate C6 transfers an output signal of the latch L1 to a node "b" in response to the signal PCLK having a logic "low" level. The inverter I9 inverts a signal PVCCH. The NMOS transistor N1 makes node "b" go to a logic "low" level in response to an output signal of the inverter I9 having a logic "high" level. The signal PVCCH is a signal that sets to and remains at a logic "low" level at a power-up and then switches to and maintains a logic "high" level after a predetermined time period. The NMOS transistor N1 resets the node "b" to a logic "low" level at a power-up. The latch L2 inverts and latches a signal at the node "b". The CMOS transmission gate C7 transfers an output signal of the latch L2 to a node "c" in response to the signal PCLK having a logic "low" level. The latch L3 inverts and latches a signal at the node "c". The inverters I12 and I13 buffer an output signal of the latch L3 to generate the signal FCRD.

An operation of the FCRD circuit generating circuit of FIG. 4 is described below.

The signal PCVCCH goes to a logic "low" level at a power-up, and the NMOS transistor N1 is turned on to pull node "b" down to a "low" level. The latch L2 inverts and latches the signal having a logic "low" level at the node "b" to generate a signal having a logic "high" level. The CMOS transmission gate C7 transfers the signal having a logic "high" level output from the latch L2 to the node "c" in response to the clock signal PCLK having a logic "low" level. The latch L3 inverts and latches the signal having a logic "high" level at the node "c" to generate a signal having a logic "low" level. The inverters I12 and I13 buffer the signal having a logic "low" level to generate the signal having a logic "low" level. The NOR gate NOR1 generates a signal having a logic "high" level in response to the signals FCWR and FCRD having a logic "low" level.

When the inverted chip selecting signal PCS having a logic "low" level and the signal FN having a logic "high" level are applied in the first external command applying cycle, the NAND NA1 generates a signal having a logic "low" level. The CMOS transmission gates C5 and C7 transfer a signal having a logic "low" level and a signal having a logic "high" level to the nodes "a" and "c", respectively, in response to the clock signal PCLK having a logic "low" level. The latches L1 and L3 invert and latch the signal having a logic "low" level and the signal having a logic "high" level at the nodes "a" and "c" to generate a signal having a logic "high" level and a signal having a logic "low" level, respectively. The CMOS transmission gate C6 transfers the signal having a logic "high" level output from the latch L1 to the node "b" in response to the clock signal PCLK having a logic "high" level. The latch L2 inverts and latches the signal having a logic "high" level at the node "b" to generate a signal having a logic "low" level. The CMOS transmission gates C5 and C7 transfer the signals having a logic "low" level output from the NAD gate NA1 and the latch L2 to the nodes "a" and "c", respectively, in response to the clock signal PCLK having a logic "low" level. The latch L3 inverts and latches the signal having a logic "low" level to generate a signal having a logic "high" level. The inverters I12 and I13 buffer the signal having a logic "high" level to generate the signal FCRD having a logic "high" level.

The NOR gate NOR1 generates a signal having a logic "low" level in response to the signal FCRD having a logic "high" level. The NAND gate NA1 generates a signal having a logic "high" level in response to the signal having a logic "low" level of the NOR gate NOR1. The CMOS transmission gates C5 and C7 transfer a signal having a logic "high" level and a signal having a logic "low" level to the nodes "a" and "c", respectively, in response to the clock signal PCLK having a logic "low" level. The latches L1 and L3 invert and latch the signal having a logic "high" level and the signal having a logic "low" level at the nodes "a" and "c" to generate a signal having a logic "low" level and a signal having a logic "high" level, respectively. The CMOS transmission gate C6 transfers the signal having a logic "high" level output from the latch L1 to the node "b" in response to the clock signal PCLK having a logic "high" level. The latch L2 inverts and latches the signal having a logic "low" level at the node "b" to generate a signal having a logic "high" level. At this moment, the signal FCRD maintains its logic "high" level. The CMOS transmission gates C5 and C7 transfer the signals having a logic "high" level to the nodes "a" and "c", respectively, in response to the clock signal PCLK having a logic "low" level. The latches L1 and L3 invert and latch the signals having a logic "high" level to generate signals having a logic "low" level, respectively. The inverters I12 and I13 buffer the "low" signal stored in the latch L3 to generate the signal FCRD having a logic "low" level.

The FCRD signal generating circuit of FIG. 4 generates the signal FCRD which transits to a logic "high" level at a falling edge of the clock signal PCLK when the read command RDA is applied in a first cycle, and generates the signal FCRD which transits to a logic "low" level at a falling edge of the next clock signal PCLK in response to the signals FCWR and FCRD.

Figure 5:
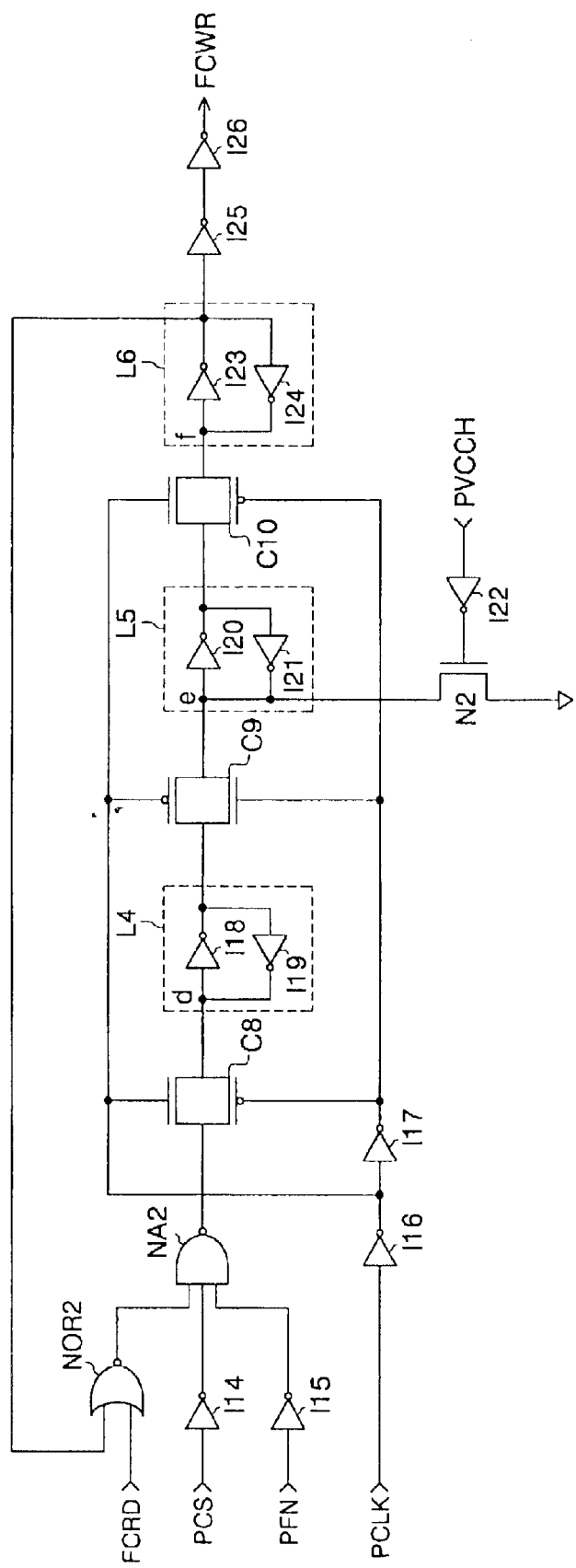
FIG. 5 is a circuit diagram illustrating the FCWR signal generating circuit of FIG. 3.

FIG. 5 is a circuit diagram illustrating the FCWR signal generating circuit of FIG. 3. The FCWR signal generating circuit of FIG. 4 includes a NOR gate NOR2, a NAND gate NA2, inverters I14 to I26, and CMOS transmission gates C8 to C10. The inverters I8 and I9, the inverters I20 and I21, and the inverters I23 and I24 constitute latches L4, L5 and L6, respectively.

The FCWR signal generating circuit of FIG. 5 has the same configuration as the FCRD signal generating circuit of FIG. 4 except an addition of the inverter I15 to invert the signal FN. That is, the NAND gate NA2 of FIG. 5 is configured to receive inverted signals of the signals PCS and PFN, while the NAND gate N1 of FIG. 4 is configured to receive an inverted signal of the signal PCS and the signal PFN.

An operation of the FCWR signal generating circuit of FIG. 5 can be understood with reference to those of FIG. 4, and therefore their description is omitted to avoid redundancy.

The FCWR signal generating circuit of FIG. 5 generates the signal FCWR which transits to a logic "high" level at a falling edge of the clock signal PCLK when the write command WRA is applied in a first cycle, and generates the signal FCWR which transits to a logic "low" level at a falling edge of the next clock signal PCLK in response to the signals FCRD and FCWR.

Figure 6:
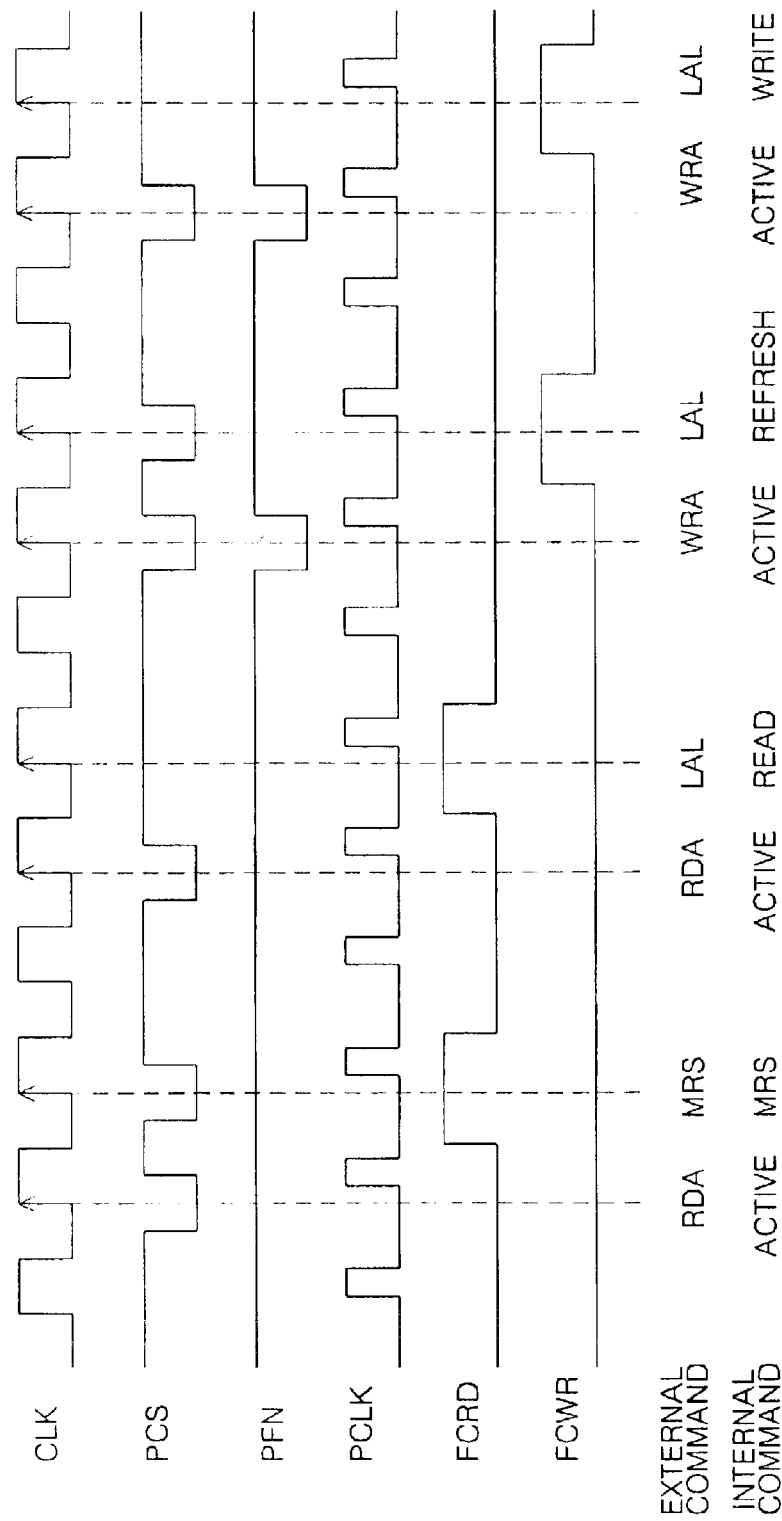
FIG. 6 is a timing diagram illustrating operations of the circuits of FIGS. 4 and 5.

FIG. 6 is a timing diagram illustrating operations of the circuits of FIGS. 4 and 5.

In FIG. 6, when the read command RDA including the signal PCS having a logic "low" level and the signal PFN having a logic "high" level is applied in case of the signal PCLK having a logic "low" level, the signal FCRD that transits to a logic "high" level at a falling edge of the clock signal PCLK is generated, and the signal FCRD holds its "high" level until a falling edge of the next clock signal PCLK. That is, when the read command RDA is applied in a first cycle, the signal FCRD having a logic "high" level is generated during one cycle in response to a falling edge of the clock signal PCLK.

When the write command WRA including the signals PCS and PFN having a logic "low" level is applied in case of the signal PCLK having a logic "low" level, the signal FCWR is generated that transits to a logic "high" level at a falling edge of the clock signal PCLK, and holds its "high" level until the next falling edge of the next clock signal PCLK. That is, when the write command WRA is applied in a first cycle, the signal FCRD having a logic "high" level is generated during one cycle in response to a falling edge of the clock signal PCLK.

In the case that the inventive semiconductor memory device operates as the FCRAM device, a decoding method of the command decoder is described below.

When the signals having PCS, FCRD and FCWR having a logic "low" level is applied at a rising edge of the clock signal CLK to apply a first external command, the active command ACTIVE is generated. When the signals PCS and FCWR having a logic "low" level and the FCRD having a logic "high" level are applied at a rising edge of the clock signal CLK to apply a second external command, the mode setting command MRS is generated. When the signals PCS and FCRD having a logic "high" level and the FCWR having a logic "low" level are applied at a rising edge of the clock signal CLK to apply a second external command, the read command READ is generated. When the signals PCS and FCRD having a logic "low" level and the FCWR having a logic "high" level are applied at a rising edge of the clock signal CLK to apply a second external command, the refresh command REFRESH is generated. When the signals PCS and FCWR having a logic "high" level and the FCRD having a logic "low" level are applied at a rising edge of the clock signal CLK to apply a second external command, the write command WRITE is generated.

In the case that the command decoder of the inventive semiconductor memory device operates as the FCRAM device, when the read command RDA or the write command WRA is applied in a first external command applying cycle, the active command ACTIVE of the DDR SDRAM device is generated. When the lower address latch command LAL is applied in a second external command applying cycle after the read command RDA, the read command READ is generated. When the lower address latch command LAL is applied in the second external command applying cycle after the write command WRA, the write command WRITE is generated.

In FIG. 3, in the case that the inventive semiconductor memory device operates as the DDR SDRAM device, the decoder 24 decodes the signals PCS, PRAS, PCAS, and PWE to generate the internal command signals MRS, ACTIVE, PRECHARGE, WRITE, READ, and REFRESH. In the case that the inventive semiconductor memory device operates as the FCRAM device, the decoder 24 decodes the signals FCRD and FCWR to generate the internal command signals MRS, ACTIVE, WRITE, READ, and REFRESH.

Table 3 shows a decoding method in the case that the inventive semiconductor memory device operates as the DDR SDRAM device.

TABLE 3

| Decoder output signal<br>Decoder input signal | MRS | ACTIVE | PRECHARGE | WRITE | READ | REFRESH |
|---|---|---|---|---|---|---|
| PCS | L | L | L | L | L | L |
| PRAS | L | L | L | H | H | L |
| PCAS | L | H | H | L | L | L |
| PWE | L | H | L | L | H | H |

Table 4 shows a decoding method in the case that the inventive semiconductor memory device operates as the FCRAM device.

TABLE 4

| Decoder output signal<br>Decoder input signal | MRS | ACTIVE | WRITE | READ | REFRESH |
|---|---|---|---|---|---|
| PCS | L | L | H | H | L |
| FCRD | H | L | L | H | L |
| FCWR | L | L | H | L | H |

In Tables 3 and 4, "L" denotes a logic "low" level, and "H" denotes a logic "high" level.

Figure 7:
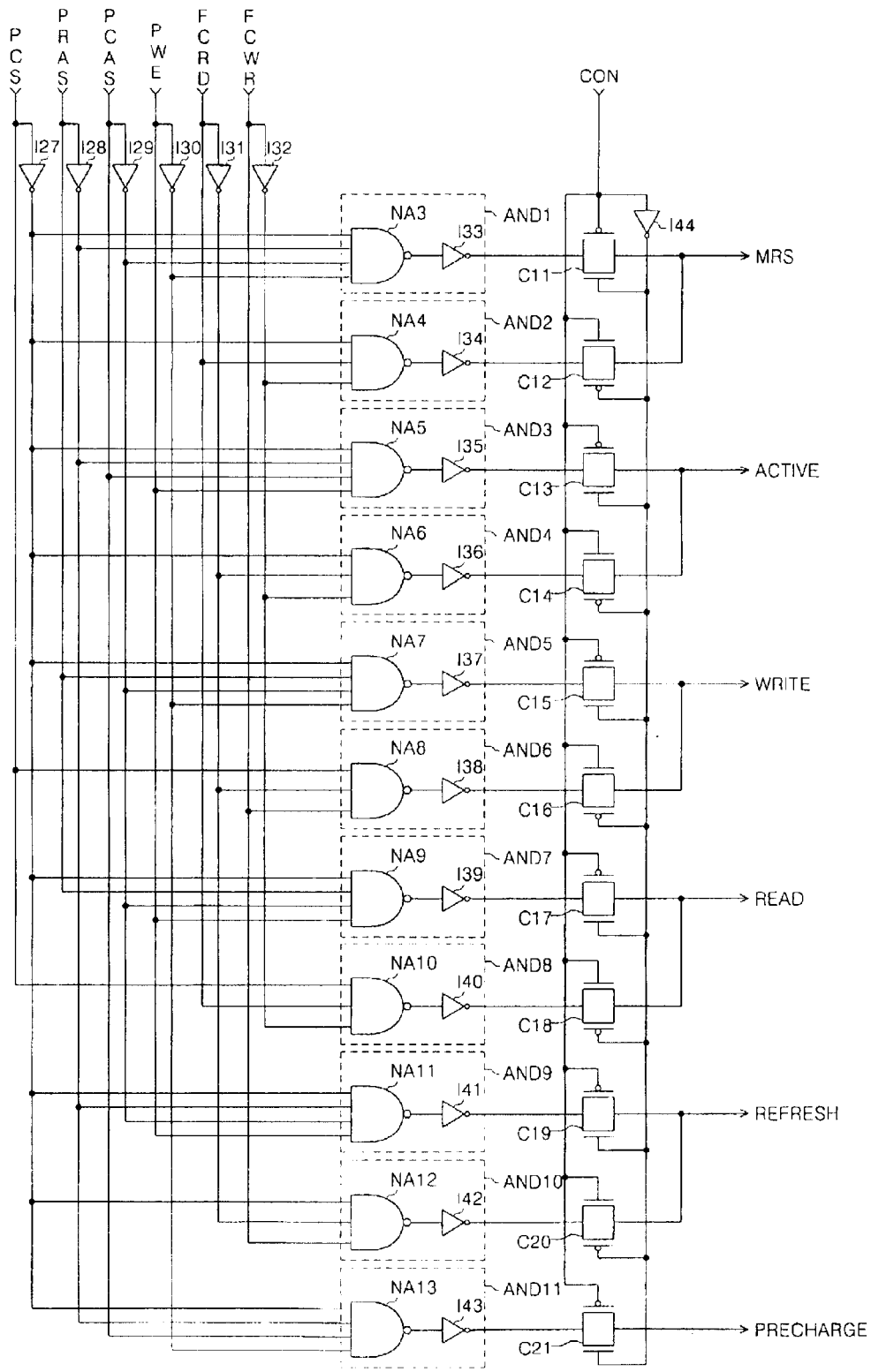
FIG. 7 is a circuit diagram illustrating the decoder of FIG. 3.

FIG. 7 is a circuit diagram illustrating the decoder 24 of FIG. 3. The decoder of FIG. 7 includes inverters I27 to I44, NAND gates NA3 to NA13, and CMOS transmission gates C11 to C21.

In FIG. 7, a NAND gate NA3 and an inverter I33 to a NAND gate NA13 and an inverter I43 constitute AND gates AND 1 to AND 11, respectively.

An operation of the decoder of FIG. 7 is described below.

The inverter I27 inverts the signal PCS. The inverter I28 inverts the signal PRAS. The inverter I29 inverts the signal PCAS. The inverter I30 inverts the signal PWE. The inverter I31 inverts the signal FCRD. The inverter I32 inverts the signal FCWR.

The AND gate AND1 ANDs output signals of the inverters I27 to I30. The AND gate AND2 ANDs output signals of the inverters I27 and I32 and the signal FCRD. The AND gate AND3 ANDs output signals of the inverters I27 and I28 and the signals PCAS and PWE. The AND gate AND4 ANDs output signals of the inverters I27, I31 and I32. The AND gate AND5 ANDs output signals of the inverters I27, I29 and I30 and the signal PRAS. The AND gate AND6 ANDs an output signal of the inverter I31 and the signals PCS and FCWR. The AND gate AND7 ANDs output signals of the inverters I27 and I29 and the signals PRAS and PWE. The AND gate AND8 ANDs an output signal of the inverter I32 and the signals PCS and FCRD. The AND gate AND9 ANDs output signals of the inverters I27 to I29 and the signal PWE. The AND gate AND10 ANDs output signals of the inverters I27 and I31 and the signal FCWR. The AND gate AND11 ANDs output signals of the inverters I27, I28 and I30 and the signal PCAS.

The CMOS transmission gates C11, C13, C15, C17, C19, and C21 receive output signals of the AND gates AND1, AND3, AND5, AND7, AND9, and AND11 to generate signals MRS, ACTIVE, WRITE, READ, REFRESH, and PRECHARGE in response to the control signal CON having a logic "low" level. The CMOS transmission gates C12, C14, C16, C18, and C20 receive output signals of the AND gates AND2, AND4, AND6, AND8, and AND10 to generate signals MRS, ACTIVE, WRITE, READ, and REFRESH in response to the control signal CON having a logic "high" level.

In other words, in the case that the inventive semiconductor memory device operates as the DDR SDRAM device, the AND gate AND1 ANDs output signals of the inverters I27 to I30 having a logic "high" level to generate the mode setting command MRS having a logic "high" level. The AND gate AND3 ANDs output signals of the inverters I27 and I28 having a logic "high" level and the signals PCAS and PWE having a logic "high" level to generate the active command ACTIVE having a logic "high" level. In the same way, the decoder decodes the signals PCS, FCRD and FCWR to generate the internal command signals WRITE, READ, REFRESH, and PRECHARGE.

In the case that the inventive semiconductor memory device operates as the FCRAM device, the AND gate AND2 ANDs output signals of the inverters I27 and I32 having a logic "high" level and the signal FCRD having a logic "high" level to generate the mode setting command MRS having a logic "high" level. The AND gate AND4 ANDs output signals of the inverters I27, I31 and I32 having a logic "high" level to generate the active command ACTIVE having a logic "high" level. In the same way, the decoder decodes the signals PCS, FCRD and FCWR to generate the internal command signals WRITE, READ, and REFRESH.

Figure 8:
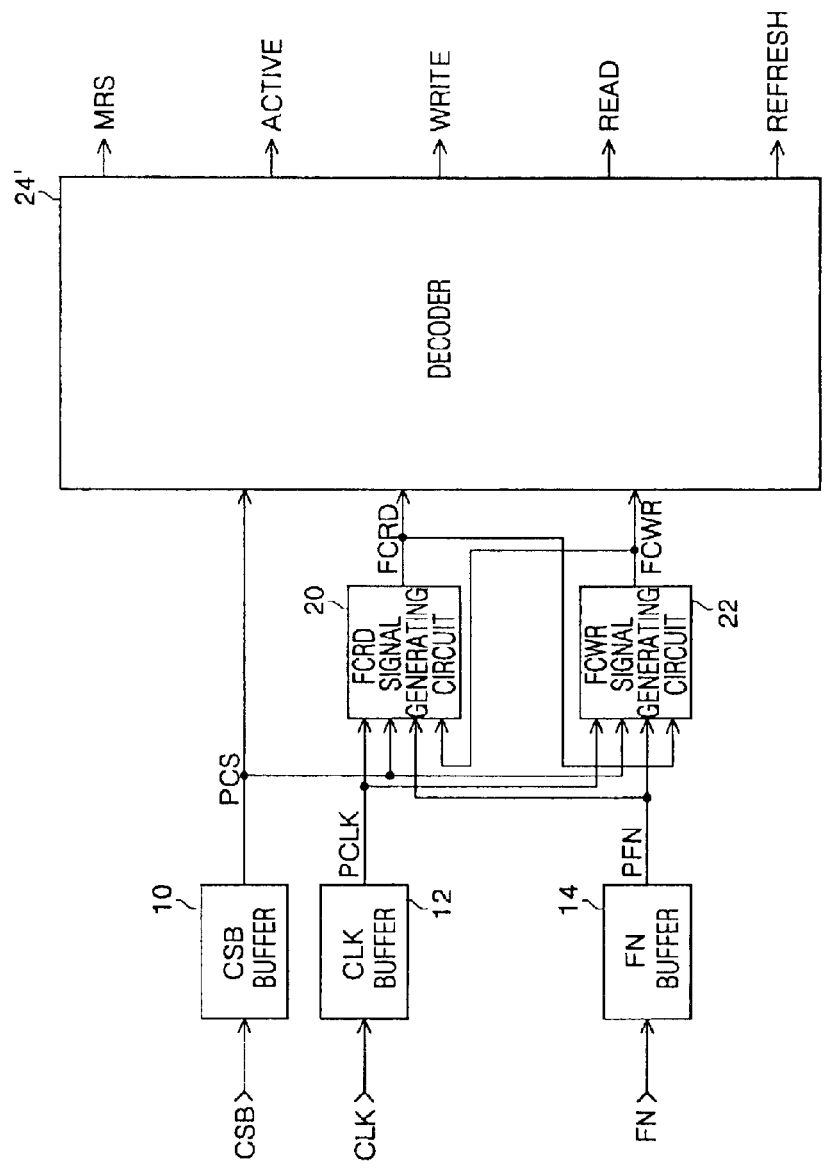
FIG. 8 is a block diagram illustrating a command decoder of the semiconductor memory device according to another embodiment of the present invention.

FIG. 8 is a block diagram illustrating a command decoder 24' of the semiconductor memory device according to another embodiment of the present invention. The command decoder of FIG. 8 includes a CSB buffer 10, a CLK buffer 12, a FN buffer 14, a FCRD signal generating circuit 20, a FCWR signal generating circuit 22, and a decoder 24'.

FIG. 8 shows only components used to operate the memory device as the FCRAM device. Like reference numerals of FIGS. 3 and 8 denote like parts, and therefore their description is omitted to avoid a redundancy. However, a configuration of the decoder 24' differs from that of FIG. 3.

Figure 9:
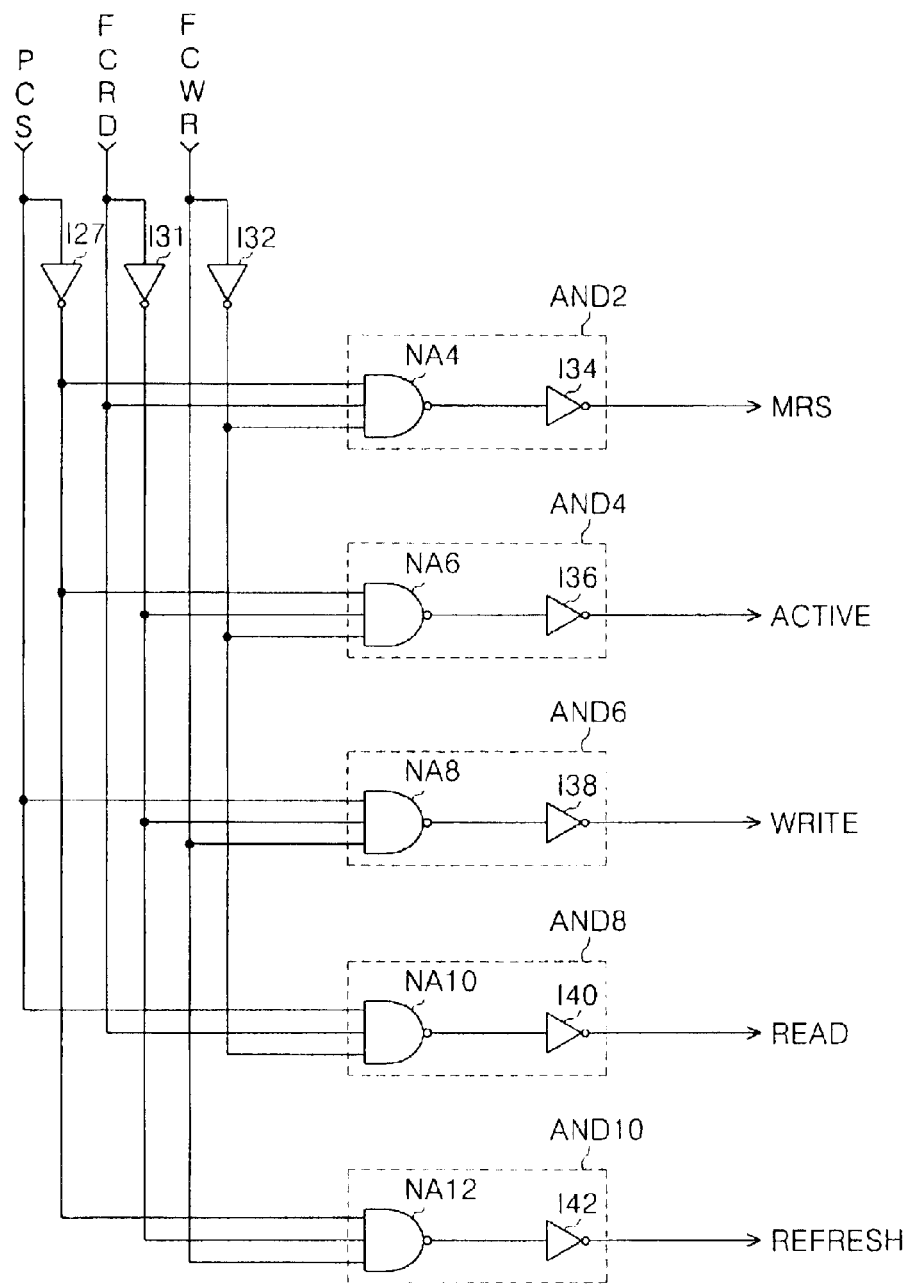
FIG. 9 is a circuit diagram illustrating the decoder of FIG. 8.

FIG. 9 is a circuit diagram illustrating the decoder 24' of FIG. 8. FIG. 9 shows only components used to operate the memory device as the FCRAM device among components of FIG. 7. The decoder of FIG. 9 includes inverters I27, I31, I32, I34, I36, I38, I40, I42 and NAND gates NA4, NA6, NA8, NA10, NA12. Like reference numerals of FIGS. 7 and 9 denote like parts, and therefore their description is omitted to avoid redundancy.

The decoder of FIG. 9 performs the same operation as described in Table 4. The mode setting command MRS is generated when the signals PCS and FCWR having a logic "low" level are applied, and the active command ACTIVE is generated when the signals PCS, FCRD and FCWR having a logic "low" level are applied. The write command WRITE is generated when the signals PCS and FCWR having a logic "high" level and the signal FCRD having a logic "low" level are applied, and the read command READ is generated when the signals PCS and FCRD having a logic "high" level and the signal FCWR having a logic "low" level are applied. The refresh command REFRESH is generated when the signals PCS and FCRD having a logic "low" level and the signal FCWR having a logic "high" level are applied.

As described herein before, the command decoder for use in the semiconductor memory device according to embodiments of the present invention can decode externally applied command signals to generate internal command signals when the inventive semiconductor memory device operates as a DDR SDRAM device and/or a FCRAM device.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A command decoder for use in a semiconductor memory device, comprising:
   a control circuit configured to operate in either a first mode or a second mode responsive to a control signal;
   a read signal generating circuit for generating a read signal that transits from a first state to a second state in response to a transition from the second state to the first state of a clock signal when an inverted chip selecting signal has the first state and an inverted row address strobe signal has the second state during a transition from the first state to the second state of the clock signal when the control circuit is in the first mode;
   a write signal generating circuit for generating a write signal that transits from the first state to the second state in response to a transition from the second state to the first state of the clock signal when the inverted chip selecting signal has the first state and the inverted row address strobe signal has the first state during a transition from the first state to the second state of the clock signal when the control circuit is in the first mode;
   a first switching circuit for transferring an inverted column address strobe signal and an inverted write enable signal when the control circuit is in the second mode; and
   a first decoding circuit for generating internal command signals by decoding the inverted chip selecting signal and the read and write signals when the control circuit is in the first mode and by decoding the inverted chip selecting signal, the inverted row address strobe signal, the inverted column address strobe signal, and the inverted write enable signal when the control circuit is in the second mode.

2. The command decoder of claim 1, further comprising a second switching circuit for receiving the inverted column address strobe signal and the inverted write enable signal to generate an address signal when the control circuit is in the first mode; and
   a second decoding circuit for decoding the address signal.

3. The command decoder of claim 1, wherein the memory device operates as a fast cycle random access memory (FCRAM) device when the control circuit is in the first mode.

4. The command decoder of claim 1, wherein the memo device operates as a double data rate synchronous dynamic random access memory (DDR SDRAM) device when the control circuit is in the second mode.

5. The decoder of claim 1, wherein the read signal generating circuit comprises:
   a NAND gate having an input for the inverted chip selecting signal, an input for the inverted row address strobe signal, and an input for a NORed signal of the read signal and the write signal;
   a first transmission gate for transferring an output signal of the NAND gate in response to the first state of the clock signal;
   a first latch for inverting and latching an output signal of the first transmission gate;
   a second transmission gate for transferring an output signal of the first latch in response to the second state of the clock signal;
   a second latch for inverting and latching an output signal of the second transmission gate;
   a third transmission gate for transferring an output signal of the second latch in response to the first state of the clock signal; and
   a third latch for inverting and latching an output signal of the third transmission gate to generate the read signal.

6. The command decoder of claim 1, wherein the write signal generating circuit comprises:
   a NAND gate having an input for the inverted chip selecting signal, an input for the inverted signal of the inverted row address strobe signal, and an input for a NORed signal of the read signal and the write signal;
   a transmission gate for transferring an output signal of the NAND gate in response to the first state of the clock signal;
   a latch for inverting and latching an output signal of the fourth transmission gate;
   a second transmission gate for transferring an output signal of the latch in response to the second state of the clock signal;
   a second latch for inverting and latching an output signal of the second transmission gate;
   a third transmission gate for transferring an output signal of the second latch in response to the first state of the clock signal; and
   a third latch for inverting and latching an output signal of the third transmission gate to generate the write signal.

7. The command decoder of claim 1, wherein the first decoding circuit includes:
- a first decoder element for generating a mode setting command when the control circuit is in the first mode, and when the inverted chip selecting signal has the first state, the inverted row address strobe signal has the first state, the inverted column address strobe signal has the first state, and the inverted write enable signal has the first state, and, when the control circuit is in the second mode, for generating the mode setting command when the inverted chip selecting signal has the first state, the read signal has the first state, and the write signal has the second state;
- a second decoder element for generating an active command when the control circuit is in the first mode, and when the inverted chip selecting signal has the first state, the inverted row address strobe signal has the first state, the inverted column address strobe signal has the second state, and the inverted write enable signal has the second state, and, when the control circuit is in the second mode, for generating the active command when the inverted chip selecting signal has the first state, the read signal has the first state, and the write signal has the first state;
- a third decoder element for generating a write command when the control circuit is in the first mode, and when the inverted chip selecting signal has the first state, the inverted row address strobe signal has the second state, the inverted column address strobe signal has the first state, and the inverted write enable signal has the first state, and, when the control circuit is in the second mode, for generating the write command when the inverted chip selecting signal has the second state, the read signal has the first state, and the write signal has the second state;
- a fourth decoder element for generating a read command when the control circuit is in the first mode, and when the inverted chip selecting signal has the first state, the inverted row address strobe signal has the second state, the inverted column address strobe signal has the first state, and the inverted write enable signal has the second state, and, when the control circuit is in the second mode, for generating the read command when the inverted chip selecting signal has the second state, the read signal has the second state, and the write signal has the first state; and
- a fifth decoder element for generating a refresh command when the control circuit is in the first mode, and when the inverted chip selecting signal has the first state, the inverted row address strobe signal has the first state, the inverted column address strobe signal has the first state, and the inverted write enable signal has the second state, and, when the control circuit is in the second mode, for generating the refresh command when the inverted chip selecting signal has the first state, the read signal has the first state, and the write signal has the second state.

8. The decoder of claim 7, wherein the first decoding circuit further includes:
- a sixth decoder element for generating a precharge command when the control circuit is in the first mode, and when the inverted chip selecting signal has the first state, the inverted row address strobe signal has the first state, the inverted write enable signal has the first state, and the inverted column address strobe signal has the second state.

9. A command decoder for use in a semiconductor memory device, comprising:
- a control circuit configured to operate in either a first mode or a second mode responsive to a control signal;
- a read signal generating circuit for generating a read signal that transits from a first state to a second state in response to a transition from the second state to the first state of a clock signal when an inverted chip selecting signal has the first state and an inverted row address strobe signal has the second state during a transition from the first state to the second state of the clock signal when the control circuit is in the first mode;
- a write signal generating circuit for generating a write signal that transits from the first state to the second state in response to a transition from the second state to the first state of the clock signal when the inverted chip selecting signal has the first state and the inverted row address strobe signal has the first state during a transition from the first state to the second state of the clock signal when the control circuit is in the first mode;
- a first switching circuit for transferring an inverted column address strobe signal and an inverted write enable signal when the control circuit is in the second mode; and
- a first decoding circuit for generating internal command signals by decoding the inverted chip selecting signal and the read and write signals when the control circuit is in the first mode and by decoding the inverted chip selecting signal, the inverted row address strobe signal, the inverted column address strobe signal, and the inverted write enable signal when the control circuit is in the second mode;

wherein the read signal generating circuit includes:
- a NAND gate having an input for the inverted chip selecting signal, an input for the inverted row address strobe signal, and an input for a NORed signal of the read signal and the write signal;
- a first transmission gate for transferring an output signal of the NAND gate in response to the first state of the clock signal;
- a first latch for inverting and latching an output signal of the first transmission gate;
- a second transmission gate for transferring an output signal of the first latch in response to the second state of the clock signal;
- a second latch for inverting and latching an output signal of the second transmission gate;
- a third transmission gate for transferring an output signal of the second latch in response to the first state of the clock signal; and
- a third latch for inverting and latching an output signal of the third transmission gate to generate the read signal.

10. A command decoder for use in a semiconductor memory device, comprising:
- a control circuit configured to operate in either a first mode or a second mode responsive to a control signal;
- a read signal generating circuit for generating a read signal that transits from a first state to a second state in response to a transition from the second state to the first state of a clock signal when an inverted chip selecting signal has the first state and an inverted row address strobe signal has the second state during a transition from the first state to the second state of the clock signal when the control circuit is in the first mode;

a write signal generating circuit for generating a write signal that transits from the first state to the second state in response to a transition from the second state to the first state of the clock signal when the inverted chip selecting signal has the first state and the inverted row address strobe signal has the first state during a transition from the first state to the second state of the clock signal when the control circuit is in the first mode;

a first switching circuit for transferring an inverted column address strobe signal and an inverted write enable signal when the control circuit is in the second mode;

a first decoding circuit for generating internal command signals by decoding the inverted chip selecting signal and the read and write signals when the control circuit is in the first mode and by decoding the inverted chip selecting signal, the inverted row address strobe signal, the inverted column address strobe signal, and the inverted write enable signal when the control circuit is in the second mode;

wherein the write signal generating circuit comprises:

a NAND gate having an input for the inverted chip selecting signal, an input for the inverted signal of the inverted row address strobe signal, and an input for a NORed signal of the read signal and the write signal;

a transmission gate for transferring an output signal of the NAND gate in response to the first state of the clock signal;

a latch for inverting and latching an output signal of the fourth transmission gate;

a second transmission gate for transferring an output signal of the latch in response to the second state of the clock signal;

a second latch for inverting and latching an output signal of the second transmission gate;

a third transmission gate for transferring an output signal of the second latch in response to the first state of the clock signal; and a third latch for inverting and latching an output signal of the third transmission gate to generate the write signal.

11. A command decoder for use in a semiconductor memory device, comprising:

a control circuit configured to operate in either a first mode or a second mode responsive to a control signal;

a read signal generating circuit for generating a read signal that transits from a first state to a second state in response to a transition from the second state to the first state of a clock signal when an inverted chip selecting signal has the first state and an inverted row address strobe signal has the second state during a transition from the first state to the second state of the clock signal when the control circuit is in the first mode;

a write signal generating circuit for generating a write signal that transits from the first state to the second state in response to a transition from the second state to the first state of the clock signal when the inverted chip selecting signal has the first state and the inverted row address strobe signal has the first state during a transition from the first state to the second state of the clock signal when the control circuit is in the first mode;

a first switching circuit for transferring an inverted column address strobe signal and an inverted write enable signal when the control circuit is in the second mode; and a first decoding circuit for generating internal command signals by decoding the inverted chip selecting signal and the read and write signals when the control circuit is in the first mode and by decoding the inverted chip selecting signal, the inverted row address strobe signal, the inverted column address strobe signal, and the inverted write enable signal when the control circuit is in the second mode;

wherein the first decoding circuit includes:

a first decoder element for generating a mode setting command when the control circuit is in the first mode, and when the inverted chip selecting signal has the first state, the inverted row address strobe signal has the first state, the inverted column address strobe signal has the first state, and the inverted write enable signal has the first state, and, when the control circuit is in the second mode, for generating the mode setting command when the inverted chip selecting signal has the first state, the read signal has the first state, and the write signal has the second state;

a second decoder element for generating an active command when the control circuit is in the first mode, and when the inverted chip selecting signal has the first state, the inverted row address strobe signal has the first state, the inverted column address strobe signal has the second state, and the inverted write enable signal has the second state, and, when the control circuit is in the second mode, for generating the active command when the inverted chip selecting signal has the first state, the read signal has the first state, and the write signal has the first state;

a third decoder element for generating a write command when the control circuit is in the first mode, and when the inverted chip selecting signal has the first state, the inverted row address strobe signal has the second state, the inverted column address strobe signal has the first state, and the inverted write enable signal has the first state, and, when the control circuit is in the second mode, for generating the write command when the inverted chip selecting signal has the second state, the read signal has the first state, and the write signal has the second state;

a fourth decoder element for generating a read command when the control circuit is in the first mode, and when the inverted chip selecting signal has the first state, the inverted row address strobe signal has the second state, the inverted column address strobe signal has the first state, and the inverted write enable signal has the second state, and, when the control circuit is in the second mode, for generating the read command when the inverted chip selecting signal has the second state, the read signal has the second state, and write signal has the first state; and a fifth decoder element for generating a refresh command when the control circuit is in the first mode, and when the inverted chip selecting signal has the first state, the inverted row address strobe signal has the first state, the inverted column address strobe signal has the first state, and the inverted write enable signal has the second state, and, when the control circuit is in the second mode, for generating the refresh command when the inverted chip selecting signal has the first state, the read signal has the first state, and the write signal has the second state.

12. The decoder of claim 11, wherein the first decoding circuit further includes:

a sixth decoder element for generating a precharge command when the control circuit is in the first mode, and when the inverted chip selecting signal has the first state, the inverted row address strobe signal has the first state, the inverted write enable signal has the first state, and the inverted column address strobe signal has the second state.

13. A method for decoding commands in a semiconductor memory device, comprising:

generating a read signal that transits from a first state to a second state in response to a transition from the second state to the first state of a clock signal when an inverted chip selecting signal has the first state and an inverted row address strobe signal has the second state, during a transition from the first state to the second state of the clock signal when the memory device operates as a first memory device;

generating a write signal that transits from the first state to the second state in response to a transition from the second state to the first state of the clock signal when the inverted chip selecting signal has the first state and the inverted row address strobe signal has the first state, during a transition from the first state to the second state of the clock signal when the memory device operates as the first memory device, and transferring an inverted column address strobe signal and an inverted write enable signal in response to a control signal having the first state when the memory device operates as a second memory device; and generating internal command signals by decoding the inverted chip selecting signal, the inverted row address strobe signal, the inverted column address strobe signal, and the inverted write enable signal when the memory device operates as the second memory device, and by decoding the inverted chip selecting signal and the read and write signals when the memory device operates as the first memory device.

14. The method of claim 13, further comprising, when the memory device operates as the second memory device, receiving the inverted column address strobe signal and the inverted write enable signal, and generating a lower address signal.

15. The method of claim 13, wherein generating internal command signals further comprises decoding the lower address signal.

16. The method of claim 13, wherein the first memory device is a fast cycle random access memory device.

17. The method of claim 13, wherein the second memory device is a double data rate synchronous dynamic random access memory device.

18. The method of claim 13, further comprising:

generating a mode setting command when the inverted chip selecting signal has the first state, the inverted row address strobe signal has the first state, the inverted column address strobe signal has the first state, and the inverted write enable signal has the first state when the memory device operates as the first memory device, and, when the inverted chip selecting signal has the first state, the write signal has the first state, and the read signal has the second state when the memory device operates as the second memory device;

generating an active command when the inverted chip selecting signal has the first state, the inverted row address strobe signal has the first state, the inverted column address strobe signal has the second state, and the inverted write enable signal has the second state when the memory device operates as the second memory device, and, when the inverted chip selecting signal has the first state, the read signal has the first state, and the write signal has the first state when the memory device operates as the first memory device;

generating a write command when the inverted chip selecting signal has the first state, the inverted row address strobe signal has the second state, the inverted column address strobe signal has the first state, and the inverted write enable signal has the first state when the memory device operates as the second memory device, and, when the inverted chip selecting signal has the second state, the read signal has the first state, and the write signal has the second state when the memory device operates as the first memory device;

generating a read command when the inverted chip selecting signal has the first state, the inverted row address strobe signal has the second state, the inverted column address strobe signal has the first state, and the inverted write enable signal has the second state when the memory device operates as the second memory device, and, when the inverted chip selecting signal has the second state, the read signal has the second state, and the write signal has the first state when the memory device operates as the first memory device; and generating a refresh command when the inverted chip selecting signal has the first state, the inverted row address strobe signal has the first state, the inverted column address strobe signal has the first state, and the inverted write enable signal has the second state when the memory device operates as the second memory device, and when the inverted chip selecting signal has the first state, the read signal has the first state, and the write signal has the second state when the memory device operates as the first memory device.

19. The method of claim 18, further including generating a precharge command when the inverted chip selecting signal has the first state, the inverted row address strobe signal has the first state, the inverted write enable signal has the first state, and the inverted column address strobe signal has the second state when the memory device operates as the second memory device.

20. A method for decoding commands in a semiconductor memory device, comprising:

generating a read signal that transits from a first state to a second state in response to a transition from the second state to the first state of a clock signal when an inverted chip selecting signal has the first state and an inverted row address strobe signal has the second state, during a transition from the first state to the second state of the clock signal when the memory device operates as a first memory device;

generating a write signal that transits from the first state to the second state in response to a transition from the second state to the first state of the clock signal when the inverted chip selecting signal has the first state and the inverted row address strobe signal has the first state, during a transition from the first state to the second state of the clock signal when the memory device operates as the first memory device, and transferring an inverted column address strobe signal and an inverted write enable signal in response to a control signal having the first state when the memory device operates as a second memory device; and generating internal command signals by decoding the inverted chip selecting signal, the inverted row address strobe signal, the inverted column address strobe signal, and the inverted write enable signal when the memory device operates as the second memory device, and by decoding the inverted chip selecting signal and the read and write signals when the memory device operates as the first memory device;

generating a mode setting command when the inverted chip selecting signal has the first state, the inverted row address strobe signal has the first state, the inverted column address strobe signal has the first state, and the inverted write enable signal has the first state when the memory device operates as the first memory device, and, when the inverted chip selecting signal has the first state, the write signal has the first state, and the read signal has the second state when the memory device operates as the second memory device;

generating an active command when the inverted chip selecting signal has the first state, the inverted row address strobe signal has the first state, the inverted column address strobe signal has the second state, and the inverted write enable signal has the second state when the memory device operates as the second memory device, and, when the inverted chip selecting signal has the first state, the read signal has the first state, and the write signal has the first state when the memory device operates as the first memory device;

generating a write command when the inverted chip selecting signal has the first state, the inverted row address strobe signal has the second state, the inverted column address strobe signal has the first state, and the inverted write enable signal has the first state when the memory device operates as the second memory device, and, when the inverted chip selecting signal has the second state, the read signal has the first state, and the write signal has the second state when the memory device operates as the first memory device;

generating a read command when the inverted chip selecting signal has the first state, the inverted row address strobe signal has the second state, the inverted column address strobe signal has the first state, and the inverted write enable signal has the second state when the memory device operates as the second memory device, and, when the inverted chip selecting signal has the second state, the read signal has the second state, and the write signal has the first state when the memory device operates as the first memory device; and generating a refresh command when the inverted chip selecting signal has the first state, the inverted row address strobe signal has the first state, the inverted column address strobe signal has the first state, and the inverted write enable signal has the second state when the memory device operates as the second memory device, and when the inverted chip selecting signal has the first state, the read signal has the first state, and the write signal has the second state when the memory device operates as the first memory device.

21. The method of claim 20, further including generating a precharge command when the inverted chip selecting signal has the first state, the inverted row address strobe signal has the first state, the inverted write enable signal has the first state, and the inverted column address strobe signal has the second state when the memory device operates as the second memory device.

22. A command decoder for use in a semiconductor memory device, comprising:

a read signal generator for generating a read signal that transits from a first state to a second state in response to a transition from the second state to the first state of a clock signal when an inverted chip selecting signal has the first state and a command signal has the second state during a transition from the first state to the second state of the clock signal;

a write signal generator for generating a write signal that transits from the first state to the second state in response to a transition from the second state to the first state of the clock signal when the inverted chip selecting signal has the first state and the command signal has the first state during a transition from the first state to the second state of the clock signal; and a decoder element for decoding the inverted chip selecting signal, the read signal and the write signal to generate internal command signals.

23. The decoder of claim 22, wherein the read signal generator includes:

a first NAND gate having the inverted chip selecting signal, the command signal, and a NORed signal of the read signal and the write signal as inputs;

a first transmission gate for transferring an output signal of the first NAND gate in response to the first state of the clock signal;

a first latch for inverting and latching an output signal of the first transmission gate;

a second transmission gate for transferring an output signal of the first latch in response to the second state of the clock signal;

a second latch for inverting and latching an output signal of the second transmission gate;

a third transmission gate for transferring an output signal of the second latch in response to the first state of the clock signal; and a third latch for inverting and latching an output signal of the third transmission gate to generate the read signal.

24. The decoder of claim 23, wherein the write signal generator includes:

a second NAND gate having the inverted chip selecting signal, an inverted signal of the command signal, a NORed signal of the read signal and the write signal as inputs;

a fourth transmission gate for transferring an output signal of the second NAND gate in response to the first state of the clock signal;

a fourth latch for inverting and latching an output signal of the fourth transmission gate;

a fifth transmission gate for transferring an output signal of the fourth latch in response to the second state of the clock signal;

a fifth latch for inverting and latching an output signal of the fifth transmission gate;

a sixth transmission gate for transferring an output signal of the fifth latch in response to the first state of the clock signal; and a sixth latch for inverting and latching an output signal of the sixth transmission gate to generate the write signal.

25. The decoder of claim 22, wherein the decoder element includes:

a first decoder for generating a mode setting command when the inverted chip selecting signal having the first state, the write signal having the first state, and the read signal having the second state are applied to the first decoder;

a second decoder for generating an active command when the inverted chip selecting signal having the first state, the read signal having the first state, and the write signal having the first state are applied to the second decoder;

a third decoder for generating a write command when the inverted chip selecting signal having the second state, the read signal having the first state, and the write signal having the second state are applied to the third decoder;

a fourth decoder for generating a read command when the inverted chip selecting signal having the second state, the read signal having the second state, and the write signal having the first state are applied to the fourth decoder; and a fifth decoder for generating a refresh command when the inverted chip selecting signal having the first state, the read signal having the first state, and the write signal having the second state are applied to the fifth decoder.

26. A command decoder for use in a semiconductor memory device, comprising:

a read signal generator for generating a read signal that transits from a first state to a second state in response to a transition from the second state to the first state of a clock signal when an inverted chip selecting signal has the first state and a command signal has the second state during a transition from the first state to the second state of the clock signal;

a write signal generator for generating a write signal that transits from the first state to the second state in response to a transition from the second state to the first state of the clock signal when the inverted chip selecting signal has the first state and the command signal has the first state during a transition from the first state to the second state of the clock signal;

a decoder element for decoding the inverted chip selecting signal, the read signal and the write signal to generate internal command signals;

wherein the read signal generator includes:

a first NAND gate having the inverted chip selecting signal, the command signal, and a NORed signal of the read signal and the write signal as inputs;

a first transmission gate for transferring an output signal of the first NAND gate in response to the first state of the clock signal;

a first latch for inverting and latching an output signal of the first transmission gate;

a second transmission gate for transferring an output signal of the first latch in response to the second state of the clock signal;

a second latch for inverting and latching an output signal of the second transmission gate;

a third transmission gate for transferring an output signal of the second latch in response to the first state of the clock signal; and a third latch for inverting and latching an output signal of the third transmission gate to generate the read signal.

27. The decoder of claim 26, wherein the write signal generator includes:

a second NAND gate having the inverted chip selecting signal, an inverted signal of the command signal, a NORed signal of the read signal and the write signal as inputs;

a fourth transmission gate for transferring an output signal of the second NAND gate in response to the first state of the clock signal;

a fourth latch for inverting and latching an output signal of the fourth transmission gate;

a fifth transmission gate for transferring an output signal of the fourth latch in response to the second state of the clock signal;

a fifth latch for inverting and latching an output signal of the fifth transmission gate;

a sixth transmission gate for transferring an output signal of the fifth latch in response to the first state of the clock signal; and a sixth latch for inverting and latching an output signal of the sixth transmission gate to generate the write signal.

28. A command decoder for use in a semiconductor memory device, comprising:

a read signal generator for generating a read signal that transits from a first state to a second state in response to a transition from the second state to the first state of clock signal when an inverted chip selecting signal has the first state and a command signal has the second state during a transition from the first state to the second state of the clock signal;

a write signal generator for generating a write signal that transits from the first state to the second state in response to a transition from the second state to the first state of the clock signal when the inverted chip selecting signal has the first state and the command signal has the first state during a transition from the first state to the second state of the clock signal;

a decoder element for decoding the inverted chip selecting signal, the read signal and the write signal to generate internal command signals;

wherein the decoder element includes:

a first decoder for generating a mode setting command when the inverted chip selecting signal having the first state, the write signal having the first state, and the read signal having the second state are applied to the first decoder;

a second decoder for generating an active command when the inverted chip selecting signal having the first state, the read signal having the first state, and the write signal having the first state are applied to the second decoder;

a third decoder for generating a write command when the inverted chip selecting signal having the second state, the read signal having the first state, and the write signal having the second state are applied to the third decoder;

a fourth decoder for generating a read command when the inverted chip selecting signal having the second state, the read signal having the second state, and the write signal having the first state are applied to the fourth decoder; and a fifth decoder for generating a refresh command when the inverted chip selecting signal having the first state, the read signal having the first state, and the write signal having the second state are applied to the fifth decoder.

29. A method for decoding a command in a semiconductor memory device, comprising:

generating a read signal that transits from a first state to a second state in response to a transition from the second state to the first state of a clock signal when an inverted chip selecting signal has the first state and a command signal has the second state during a transition from the first state to the second state of the clock signal;

generating a write signal that transits from the first state to the second state in response to a transition from the second state to the first state of the clock signal when the inverted chip selecting signal has the first state and the command signal has the first state during a transition from the first state to the second state of the clock signal; and decoding the inverted chip selecting signal, the read signal and the write signal to generate internal command signals.

30. A method for decoding a command in a semiconductor memory device, comprising:

generating a read signal that transits from a first state to a second state in response to a transition from the second state to the first state of a clock signal when an inverted chip selecting signal has the first state and a command signal has the second state during a transition from the first state to the second state of the clock signal;

generating a write signal that transits from the first state to the second state in response to a transition from the second state to the first state of the clock signal when the inverted chip selecting signal has the first state and the command signal has the first state during a transition from the first state to the second state of the clock signal;

decoding the inverted chip selecting signal, the read signal and the write signal to generate internal command signals;

generating a mode setting command when the inverted chip selecting signal has the first state, the write signal has the first state, and the read signal has the second state;

generating an active command when the inverted chip selecting signal has the first state, the read signal has the first state, and the write signal has the first state;

generating a write command when the inverted chip selecting signal has the second state, the read signal has the first state, and the write signal has the second state;

generating a read conunand when the inverted chip selecting signal has the second state, the read signal has the second state, and the write signal has the first state; and generating a refresh command when the inverted chip selecting signal has the first state, the read signal has the first state, and the write signal has the second state.

31. The method of claim 29, further comprising:

generating a mode setting command when the inverted chip selecting signal has the first state, the write signal has the first state, and the read signal has the second state;

generating an active command when the inverted chip selecting signal has the first state, the read signal has the first state, and the write signal has the first state;

generating a write command when the inverted chip selecting signal has the second state, the read signal has the first state, and the write signal has the second state generating a read command when the inverted chip selecting signal has the second state, the read signal has the second state, and the write signal has the first state; and generating a refresh command when the inverted chip selecting signal has the first state, the read signal has the first state, and the write signal has the second state.

* * * * *

UNITED STATES PATENT AND TRADEMARK OFFICE
CERTIFICATE OF CORRECTION

PATENT NO. : 6,842,373 B2
DATED : January 11, 2005
INVENTOR(S) : La et al.

It is certified that error appears in the above-identified patent and that said Letters Patent is hereby corrected as shown below:

<u>Column 3,</u>
Table 2, row 3, replace "External" with -- External Command --.
Table 2, row 4, delete "command" and leave the space blank.

<u>Column 7,</u>
Line 36, replace " "high" " with -- "low" --.

<u>Column 12,</u>
Line 7, replace "comprising" with -- comprising, --.
Line 17, replace "memo" with -- memory --.

<u>Column 22,</u>
Line 18, replace "clock signal" with -- a clock signal --.

<u>Column 24,</u>
Line 25, replace "state" with -- state; --.

Signed and Sealed this

Thirtieth Day of May, 2006

JON W. DUDAS
*Director of the United States Patent and Trademark Office*